(12) United States Patent
Naulleau

(10) Patent No.: US 6,859,263 B2
(45) Date of Patent: Feb. 22, 2005

(54) APPARATUS FOR GENERATING PARTIALLY COHERENT RADIATION

(75) Inventor: Patrick P. Naulleau, Oakland, CA (US)

(73) Assignee: EUV LLC, Santa Clara, CA (US)

( * ) Notice: Subject to any disclaimer, the term of this patent is extended or adjusted under 35 U.S.C. 154(b) by 142 days.

(21) Appl. No.: 10/377,947

(22) Filed: Feb. 28, 2003

(65) Prior Publication Data

US 2003/0174303 A1 Sep. 18, 2003

Related U.S. Application Data

(63) Continuation-in-part of application No. 09/944,391, filed on Aug. 30, 2001.

(51) Int. Cl.[7] .................. G03B 27/54; G03B 27/42; G02B 5/10; G02B 27/30; G21K 5/00
(52) U.S. Cl. ................ 355/67; 355/53; 359/366; 359/641; 359/857; 359/858; 378/34
(58) Field of Search ............... 355/56, 67, 71, 355/77; 359/364, 365, 366, 641, 730, 731, 854, 857, 858, 859; 378/34

(56) References Cited

U.S. PATENT DOCUMENTS

| | | | | |
|---|---|---|---|---|
| 4,974,919 A | * | 12/1990 | Muraki et al. | 359/204 |
| 5,307,207 A | * | 4/1994 | Ichihara | 359/622 |
| 5,510,230 A | * | 4/1996 | Tennant et al. | |
| 5,512,759 A | * | 4/1996 | Sweatt | |
| 5,534,970 A | * | 7/1996 | Nakashima et al. | 355/53 |
| 5,920,380 A | * | 7/1999 | Sweatt | |
| 6,033,079 A | * | 3/2000 | Hudyma | |
| 6,072,852 A | * | 6/2000 | Hudyma | |
| 6,084,938 A | * | 7/2000 | Hara et al. | |
| 6,183,095 B1 | * | 2/2001 | Hudyma | |
| 6,188,513 B1 | * | 2/2001 | Hudyma | |
| 6,198,793 B1 | * | 3/2001 | Schultz et al. | |
| 6,226,346 B1 | * | 5/2001 | Hudyma | |
| 6,262,836 B1 | * | 7/2001 | Hudyma et al. | |
| 6,573,978 B1 | * | 6/2003 | McGuire, Jr. | 355/71 |

OTHER PUBLICATIONS

Naulleau, P. et al., "Characterization of the accuracy of EUV phase–shifting point diffraction interferometry", SPIE. vol. 3331, pp. 114–123.*
White, D.L. et al., "Modification of the coherence of undulator radiation", Rev. Sci. Instrum., 66 (2), Feb. 1995, pp. 1930–1933.*
Naulleau, P. et al., "Characterization of the accuracy of EUV phase–shifting point diffraction interferometry", *SPIE*, vol. 3331, pp. 114–123.*
White, D.L. et al., "Modification of the coherence of undulator radiation", *Rev. Sci. Instrum.*, 66 (2), Feb. 1995, pp. 1930–1933.*

\* cited by examiner

*Primary Examiner*—Alan Mathews
(74) *Attorney, Agent, or Firm*—Fliesler Meyer LLP

(57) ABSTRACT

Techniques for generating partially coherent radiation and particularly for converting effectively coherent radiation from a synchrotron to partially coherent EUV radiation suitable for projection lithography.

23 Claims, 6 Drawing Sheets

APPARATUS FOR GENERATING PARTIALLY COHERENT RADIATION

REFERENCE TO RELATED APPLICATION

This application is a continuation-in-part application of application Ser. No. 09/944,391, filed on Aug. 30, 2001, which is incorporated herein in its entirety.

The U.S. Government has certain rights in this invention pursuant to Contract No. DE-AC03-76SF00098 between the United States Department of Energy and the University of California for the operation of the Lawrence Berkeley National Laboratory.

FIELD OF THE INVENTION

EUV lithography (EUVL) is an emerging technology in the microelectronics industry. It is one of the leading candidates for the fabrication of devices with feature sizes of 45 nm and smaller. Synchrotron radiation facilities provide a convenient source of EUV radiation for the development of this technology.

This invention relates to techniques for generating partially coherent radiation and particularly for converting effectively coherent radiation from a synchrotron to partially coherent extreme ultraviolet radiation suitable for projection photolithography.

BACKGROUND OF THE INVENTION

In general, lithography refers to processes for pattern transfer between various media. A lithographic coating is generally a radiation-sensitized coating suitable for receiving a cast image of the subject pattern. Once the image is cast, it is indelibly formed on the coating. The recorded image may be either a negative or a positive of the subject pattern. Typically, a "transparency" of the subject pattern is made having areas which are selectively transparent or opaque to the impinging radiation. Exposure of the coating through the transparency placed in the close longitudinal proximity to the coating causes the exposed area of the coating to become selectively crosslinked and consequently either more or less soluble (depending on the coating) in a particular solvent developer. The more soluble (i.e., uncrosslinked) areas are removed in the developing process to leave the pattern image in the coating as less soluble crosslinked polymer.

Projection lithography is a powerful and essential tool for microelectronics processing and has supplanted proximity printing. "Long" or "soft" x-rays (a.k.a. Extreme UV) (wavelength rate of 10 to 20 nm) are now at the forefront of research in efforts to achieve smaller transferred feature sizes. With projection photolithography, a reticle (or mask) is imaged through a reduction-projection (demagnifying) lens onto a wafer. Reticles for EUV projection lithography typically comprise a glass substrate coated with an EUV absorbing material covering portions of the reflective surface. In operation, EUV radiation from the illumination system (condenser) is projected toward the surface of the reticle and radiation is reflected from those areas of the reticle reflective surface which are exposed, i.e., not covered by the EUV absorbing material. The reflected radiation is re-imaged to the wafer using a reflective optical system and the pattern from the reticle is effectively transcribed to the wafer.

A source of EUV radiation is the laser-produced plasma EUV source, which depends upon a high power, pulsed laser (e.g., a yttrium aluminum garnet ("YAG") laser, or an excimer laser, delivering 500 to 1,000 watts of power to a 50 $\mu$m to 250 $\mu$m spot, thereby heating a source material to, for example 250,000° C., to emit EUV radiation from the resulting plasma. Plasma sources are compact, and may be dedicated to a single production line so that malfunction does not close down the entire plant. A stepper employing a laser-produced plasma source is relatively inexpensive and could be housed in existing facilities. It is expected that EUV sources suitable for photolithography that provide bright, incoherent EUV and that employ physics quite different from that of the laser-produced plasma source will be developed. One such source under development is the EUV discharge source.

EUV lithography machines for producing integrated circuit components are described, for example, in U.S. Pat. No. 6,031,598 to Tichenor et al. Referring to FIG. 13, the EUV lithography machine comprises a main vacuum or projection chamber 2 and a source vacuum chamber 4. Source chamber 4 is connected to main chamber 2 through an airlock valve (not shown) which permits either chamber to be accessed without venting or contaminating the environment of the other chamber. Typically, a laser beam 30 is directed by turning mirror 32 into the source chamber 4. A high density gas, such as xenon, is injected into the plasma generator 36 through gas supply 34 and the interaction of the laser beam 30, and gas supply 34 creates a plasma giving off the illumination used in EUV lithography. The EUV radiation is collected by segmented collector 38, that collects about 30% of the available EUV light, and the radiation 40 is directed toward the pupil optics 42. The pupil optics consists of long narrow mirrors arranged to focus the rays from the collector at grazing angels onto an imaging mirror 43 that redirects the illumination beam through filter/window 44. Filter 44 passes only the desired EUV wavelengths and excludes scattered laser beam light in chamber 4. The illumination beam 45 is then reflected from the relay optics 46, another grazing angel mirror, and then illuminates the pattern on the reticle 48. Mirrors 38, 42, 43, and 46 together comprise the complete illumination system or condenser. The reflected pattern from the reticle 48 then passes through the projection optics 50 which reduces the image size to that desired for printing on the wafer. After exiting the projection optics 50, the beam passes through vacuum window 52. The beam then prints its pattern on wafer 54.

Although no longer under serious consideration for high-volume commercial fabrication applications, synchrotron sources play an extremely important role in the development of EUV lithography technology. Being readily available, highly reliable, and efficient producers of EUV radiation, synchrotron radiation sources are well suited to the development of EUV lithography. These sources are currently used for a variety of at-wavelength EUV metrologies such as reflectometry, interferometry and scatterometry.

In the case of synchrotron radiation sources, there are three types of sources: bending magnets, wigglers, and undulators. In bending magnet sources, the electrons are deflected by a bending magnet and photon radiation is emitted. Wiggler sources comprise a so-called wiggler for the deflection of the electron or of an electron beam. The wiggler includes a multiple number of alternating poled pairs of magnets arranged in a series. When an electron passes through a wiggler, the electron is subjected to a periodic, vertical magnetic field; the electron oscillates correspondingly in the horizontal plane. Wigglers are further characterized by the fact that no coherency effects occur. The synchrotron radiation produced by a wiggler is similar to that of a bending magnet and radiates in a horizontal steradian. In contrast to the bending magnet, it has a flow that is reinforced by the number of poles of the wiggler.

Finally, in the case of undulator sources, the electrons in the undulator are subjected to a magnetic field with shorter periods and a smaller magnetic field of the deflection pole than in the case of the wiggler, so that interference effects of synchrotron radiation occur. Due to the interference effects, the synchrotron radiation has a discontinuous spectrum and radiates both horizontally and vertically in a small steradian element, i.e., the radiation is strongly directed.

In lithographic applications, the partial coherence of the illumination (sigma) is often defined as the ratio of the illumination angular range to the numerical aperture of the imaging (projection optical) system. The illumination angular range is also referred to as the divergence of the source. Undulator radiation is much like a laser source in that it produces highly-coherent light of very low divergence. A typical EUV undulator beamline produces a sigma of less than 0.1 whereas lithographic application nominally require a signal of 0.7 or higher. Although less coherent than undulator radiation, bending magnet radiation is also typically too coherent to be directly used for lithography.

As EUV lithography technology matures, more lithographic printing stations will be required for resist and process development. Proliferation of these systems has been slowed by the lack of reliable and cost-effective EUV sources. It would be greatly desirable to alleviate the dearth of EUV sources for lithographic process development applications in the form of small-field static microsteppers through the use of synchrotron radiation. The relatively high coherence of these sources, however, has precluded them from being used more extensively for actual lithography studies. Relevant process development applications require much more incoherence than is inherently provided by synchrotron sources. This is especially true of undulator sources that otherwise would be highly desirable for their large EUV power capabilities.

SUMMARY OF THE INVENTION

The present invention allows the effective coherence of a synchrotron beamline to be tailored to photolithography applications. More generally the presention invention can be employed for any technique requiring partially coherent illumination such as microscopy, lithography, and coherence tomography.

In one embodiment, the invention is directed to an illuminator device for an optical image processing system, wherein the image processing system comprises an optical system requiring partially coherent illumination, and where the illuminator includes:

a small point-like source of coherent or partially coherent radiation which has an intrinsic coherence that is higher than the desired coherence;

a source imaging optic that receives incident radiation from said source;

a scanning optic that moves the focal location of imaged point source effectively creating an incoherent spatially extended source;

means for moving said scanning surface through a desired range of angles in two dimensions wherein the rate of motion is fast relative to integration time of said image processing system; and a collimating optic wherein each source point of the spatially extended source generates a plane wave emanating in a different direction.

In another embodiment, the invention is directed to an illuminator device for an optical image processing system, wherein the image processing system comprises an optical system requiring partially coherent illumination, and where the illuminator includes:

a source of coherent or partially coherent radiation which has an intrinsic coherence that is higher than the desired coherence;

a scanning optic which receives incident radiation from said source and creates an incoherent effective source consisting of plane waves emanating in different directions;

means for moving said scanning surface through a desired range of angles in two dimensions wherein the rate of motion is fast relative to integration time of said image processing system;

an imaging optic which re-images said scanning surface to the entrance pupil of said optical image processing system;

an aperture on the scanning optic to control the effective source size; and means for controlling said aperture size and thus partial coherence of effective source.

In yet another embodiment, the invention is directed to a method for modifying the coherence of a beam of radiation from a high coherence radiation source with higher than desired intrinsic coherence that includes the steps of:

directing the beam of radiation into a source imaging reflective optic which forms a real image of the source;

redirecting the beam with a reflective surface positioned between said source imaging optic and said image of source;

moving said reflective surface through a desired range of angles in two dimensions wherein the rate of motion is fast relative to the subsequent observation time; and collimating the light emanating from the image of the source thereby converting the imaged source points into plane waves.

In a further embodiment, the invention is directed to a method for modifying the coherence of a beam of radiation from a high coherence radiation source with higher than desired intrinsic coherence that comprises the steps of:

directing the beam of radiation into a reflective surface that creates a plane wave;

modifying the source size by masking the reflective surface;

moving the reflective surface through a desired range of angles in two dimensions wherein the rate of motion is fast relative to the subsequent observation time; and focusing the beam reflected from said moving surface using a mirror positioned such that said moving surface lies substantially in the front focal plane of said focusing mirror.

In yet another embodiment, the invention is directed to an illuminator device for an optical image processing system, wherein the image processing system comprises an optical system requiring partially coherent illumination, and where the illuminator includes:

a small point-like low divergence source of coherent or partially coherent radiation which has an intrinsic coherence that is higher than the desired coherence;

a divergence-synthesis scanning optic that receives incident radiation from said source and generates a first effective source with desired source divergence;

means for moving said divergence synthesis scanning optic through a desired range of angles in two dimensions wherein the rate of motion is fast relative to integration time of said image processing system;

a source imaging optic that receives incident radiation from said divergence optic and images the first effective source;

a scanning optic that moves the focal location of said imaged first effective source creating a second effective source which has the character of an incoherent spatially extended source with desired spatial extent;

means for moving said scanning surface through a desired range of angles in two dimensions wherein the rate of motion is fast relative to said scan speed of said diverge synthesis scanning optic; and a collimating optic wherein points of the second effective source generates plane waves emanating in a different directions.

In another further embodiment, the invention is directed to an illuminator device for an optical image processing system, wherein the image processing system comprises an optical system requiring partially coherent illumination, and where the illuminator includes:

a low divergence source of coherent or partially coherent radiation which has an intrinsic coherence that is higher than the desired coherence;

a source-size synthesis scanning and imaging optic that receives incident radiation from said low divergence source and moves the focal location creating a first effective source which has the character of an incoherent spatially extended source with desired spatial extent;

means for moving said source-size synthesis scanning and imaging optic through a desired range of angles in two dimensions wherein the rate of motion is fast relative to integration time of said image processing system;

a divergence-synthesis scanning optic that receives incident radiation from the first effective source and generates a second effective source with desired source divergence;

means for moving said divergence synthesis scanning optic through a desired range of angles in two dimensions wherein the rate of motion is fast relative to the scan speed of said source-size synthesis scanning optic; and a collimating optic wherein points of the second effective source generates-plane waves emanating in a different directions.

In yet another further embodiment, the invention is directed to a method of modifying the coherence and field size of a beam of radiation that includes the steps of:

directing the beam of radiation onto a first reflective surface;

increasing the source divergence by moving said first reflective surface through a desired range of angles in two dimensions wherein the rate of motion is fast relative to the subsequent observation time;

directing output of the divergent source onto a second reflective surface which forms a real image of said moving first reflective surface;

increasing the source size by moving said second reflective surface through a desired range of angles in two dimensions wherein the rate of motion is fast relative to said rate of motion of said first reflective surface; and collimating the image points created by said second moving reflective surface using a third reflective optic positioned such that said real image of the first reflective surface lies substantially in the front focal plane of said third reflective optic.

In another further embodiment, the invention is directed to a method of modifying the coherence and field size of a beam of radiation that includes the steps of:

directing the beam of radiation onto a first scanning and focusing reflective optic that focuses the beam onto a second reflective surface;

increasing the source size by moving said first reflective surface through a desired range of angles in two dimensions wherein the rate of motion is fast relative to the subsequent observation time;

redirecting the beam by reflecting from said second reflecting surface;

increasing the source divergence by moving said second reflective surface through a desired range of angles in two dimensions wherein the rate of motion is fast relative to said rate of motion of said first reflective surface; and collimating the diverging beam emanating from said second reflective surface using a third reflective optic positioned such that said second reflective surface lies substantially in the front focal plane of said third reflective optic.

DETAILED DESCRIPTION OF THE PREFERRED EMBODIMENTS

Figure 1:
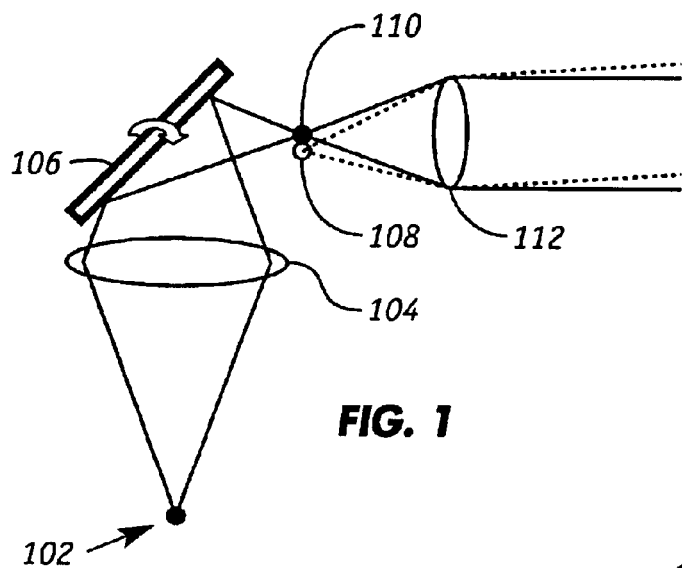
FIG. 1 illustrates a scanning Köhler illuminator shown in simple lens and scan mirror configuration.

Scanning Coherence Controlling Köhler Illuminators for Microfield Lithography Applications The Köhler illuminator is an important class of illumination systems that can be described as providing a Fourier-transform relationship between the source and the target illumination plane. A simple manifestation of such a system is a single lens where the source is placed in the front focal plane and the target illumination plane in the back focal plane. In this configuration, the lens can be seen as a collimating optic with respect to the source. Each individual source point, where a source point is defined as an elemental independent point radiator, can then be viewed as generating a plane wave exiting the lens at some unique angle. For a source point centered on the lens optical axis, the plane wave will travel along the optical axis and for any other source point, the exit angle will be determined by the angle defined by the source point offset from the optical axis and the distance to the lens (the front focal length of the lens).

Because there exists a Fourier-transform relationship between illumination angular bandwidth and spatial coherence, the coherence area at the target illumination plane can be seen to be inversely proportional to the source size or extent in the front focal plane, where source size is defined as the number of independent point radiators comprising the source. If this intrinsic source size is small, as is the case, for example, with undulator radiation, than the coherence will be high. In general, however, optimal imaging conditions rely on lower coherence and preferably the coherence can be controlled in situ allowing illumination conditions to be tailored to the imaging situation. When using an intrinsically coherent source, an extended source can be synthesized through a scanning process. If, for example, the source located in the front focal plane is moved through a variety of lateral positions relative to the optical axis, it is evident that a time series of plane waves of different angles will be produced by the lens. Because these different synthesized source points never co-exist in time, they can be considered as independent radiators as required for reduced coherence. By controlling the extent of the scanning, any desired coherence function can be generated in the target illumination plane. The extent of the source can be controlled by using an imaging optic to re-image the actual source to the front focal plane of the Köhler lens while inserting a scanning reflecting mirror between the actual source and the back focal plane of the imaging lens. This scanning mirror can be on either side of the imaging lens. In order to realize this coherence control. The observation (image integration) time, must be as least as long as it takes to scan through all desired source points.

In the illumination scheme described above, the spatial extent of the illumination in the target illumination plane is determined by the intrinsic divergence of each individual source point. Because the lens collimates the light from the source, the illumination size will depend essentially and the maximum divergence angle of the source and the distance from the source to the lens (the front focal length). If this intrinsic divergence combined with the lens focal length of choice does not provide adequate illumination extent, then a second scanning process can be used to synthesize source divergence. In this mode both the source size and angle extent (spatial frequency) are synthesized and we refer to this as a dual-domain (spatial and spatial frequency) scanning mode. To implement this dual-domain method, a second scanning mirror can be positioned at the image plane of the source imaging optic. This second scanning mirror can then be used to increase the effective divergence of the re-imaged source, thereby controlling the illumination extent leaving the Köhler lens. In this case it is important that the entire target divergence be synthesized for each synthesized source point, thus the divergence scanner must be fast enough to travel through its full range at each source scan point. In other words, the divergence scanner must be much faster than the source size scanner. For example, if the source size scanner is programmed to scan through a total of 100 source points in 1 second, the divergence scanner will have to scan through its entire target range in 1/100 of a second. As for the single scan mode, the observation (image integration) time, must be as least as long as it takes to scan through all desired source points. It is noted, however, that the relative relationship of the scanner speeds can be reversed such that at each divergence angle, the full range of source points is synthesized, thus here the source size scanner must be faster than the divergence scanner. In this case, the integration time must be at least as long as it takes for the divergence scanner to complete its entire target range.

Source-Size Synthesizing Coherence Controlling Köhler Illuminator for Microfield Lithography Applications FIG. 1 illustrates a scanning Köhler illuminator shown in a simple lens and scan mirror configuration, which is suited for visible light applications, e.g., microscopes. A diverging point source of visible light 102 is positioned in the object plane of a source imaging optic (i.e., lens) 104 and a flat scanning mirror 106 is positioned between the image plane of lens 104 and the lens 104 itself. The second lens 112 collimates the light coming from the effective source points created by imaging optic 104. As scanning mirror 106 is scanned, it effectively changes or moves the image point around at the back focal plane of lens 112 to multiple positions. Thus, the output of lens 112 has plane waves traveling at different angles. By controlling the angular range of scanning mirror 106, the set of angles coming out of lens 112 can be regulated. As shown, the effective extended source is illustrated at two discrete scan positions 108, 110.

Figure 1A:
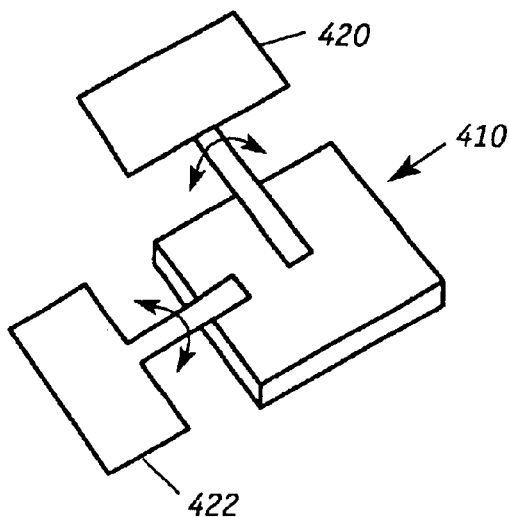
FIG. 1A illustrates a scanning mirror moving in two dimensions.

As shown in FIG. 1A, the movement of scanning mirror 410 which is scanned in two dimensions is preferably controlled by tip/tilt mechanisms 420, 422 such that the scanning mirror 410 is able to quickly travel through a desired range of angles in two dimensions. This tip/tilt mechanism could be a commercially available piezo stage such as the two-axis mirror tilter made by Piezo Systems, Inc. of Cambridge, Mass.

The source imaging and collimating optics can be conventional transmission lenses and the scanning mirror 106 can be fabricated of any suitable surface that is reflective to visible radiation. For example, the surface can be fabricated from polished aluminum, silver, or chromium. Preferably, the scanning mirror is a flat mirror, which is a mirror whose surface is nearly flat within manufacturing tolerances. The function of the single element for each of the imaging and collimating optics can be provided by a more complex multi-element or compound optical system. Moreover, the function of the 2-D scanning element can be provided by combining multiple 1-D scanning elements. Similar designs of the scanning mirror, source imaging optic and collimating optic are applicable for the other embodiments that employ simple lens and scan mirror systems for visible light as described herein.

Figure 2:
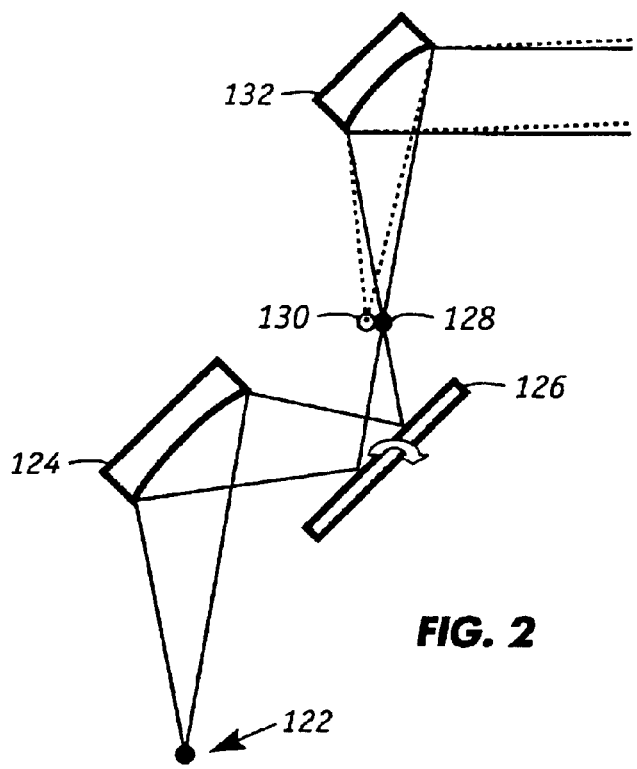
FIGS. 2 and 3 illustrate scanning Köhler illuminators shown in all-mirror configuration systems.

FIG. 2 illustrates a scanning Köhler illuminator that is equipped with an all-mirror system which thereby permits EUV applications. In this configuration, a scanning mirror 126 is strategically positioned between source imagining mirror 124 and collimating optic mirror 132. Operation of this system is analogous to that of FIG. 1 so that EUV radiation from EUV radiation source 122 can be manipulated by controlling scanning mirror 126 to create an effective source at multiple positions, e.g., 128, 130. The movement of scanning mirror 126 can also be controlled by the same tip/tilt mechanisms shown in FIG. 1A for the scanning mirror 106 described above.

Each of the scanning mirror 126, source imaging optic 124, and collimating optic 132 can be fabricated of any suitable surface that is reflective to EUV radiation or may be made reflective to EUV radiation by deposition of a reflective multilayer, e.g., of molybdenum and silicon. Preferably, the scanning mirror is a flat mirror, which is a mirror whose surface is nearly flat within manufacturing tolerances. In the preferred embodiment for each of the source imaging optic 124 and collimating optic 132, its function is preferably provided by a single conventional concave spherical, whose surface forms part of a sphere.

Although the present invention employs the use of spherical mirrors for convenience and economical concerns, it is intended that other mirrors be covered by the present invention, such as toroidal, and conic section, e.g., parabolic, hyperbolic, general aspheric, elliptical, cylindrical, etc., mirrors that may be substituted for spherical mirrors within tolerable industry standards, including those with minor flaws and aberrations. Also as described above, the function of the single source imaging optic and collimating optic could also be provided by a more complex multi-element optical system, however, compound systems, i.e., those having more than one element, tend to be less efficient. Moreover, the function of the 2-D scanning element can be provided by combining multiple 1-D scanning elements. Similar designs of the scanning mirror, source imaging optic and collimating optic are applicable for the other embodiments that employ all mirror configurations for EUV radiation as described herein.

Figure 3:
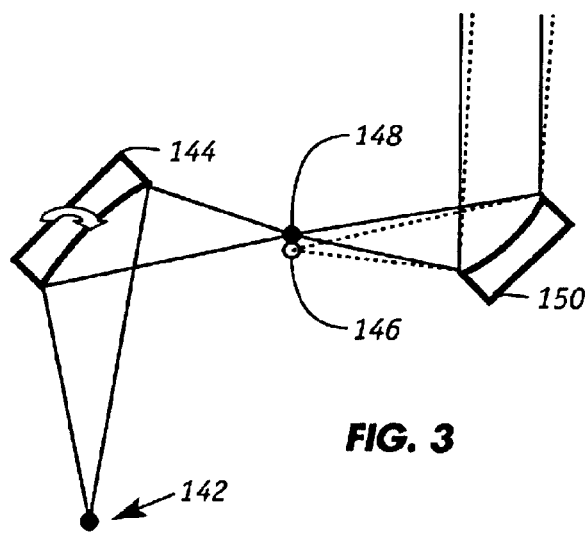

FIG. 3 illustrates another embodiment of an all-mirror configuration for the scanning Köhler illuminator wherein the source imaging and scanning functions are combined into a single optic. In this case, imaging mirror 144 is also maneuverable so that as it is scanned, EUV radiation from source 142 is imaged to multiple effective source positions, e.g., scan positions 146, 148. In other words, mirror 144 serves both as the initial imaging optic and the scanning optic; because it is a mirror it can scan and focus at the same time. Collimating mirror 150 collimates the light from the effective source.

The devices illustrated in FIGS. 1–3 synthesize an effective extended source, i.e., comprising multiple individual point radiators, by laterally scanning a small source, i.e., non-extended or coherent source, through the collimator optic entrance plane (the front focal plane). Alternatively, the effective source can be synthesized in the spatial frequency domain instead of the spatial domain. In this latter case, the scanning mirror itself would be in the collimating optic entrance plane. Assuming the scanning mirror to be illuminated by a plane wave (a coherent point source at distance infinity), the collimating optic would produce a point image in the exit plane (back focal plane) of the Köhler optic which normally is set to coincide with the object plane of the subsequent imaging system. Tilting the scanning mirror would cause this point image to move, thus the control provided by the scanning would be to the illumination field size as opposed to the partial coherence. In this case, partial coherence control could be provided by an aperture on the scanning mirror. Because the scanning mirror itself is the effective source, controlling the source size by way of masking said mirror will effectively control the source size and thus the partial coherence.

Figure 4:
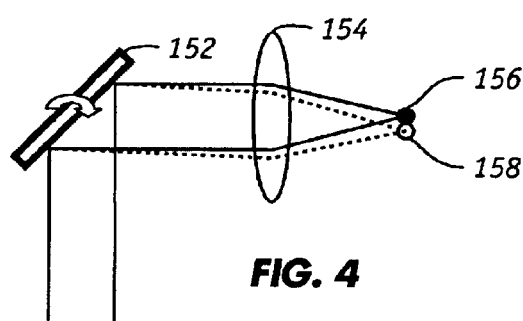
FIG. 4 illustrates a spatial-frequency domain scanning Köhler illuminator shown in simple lens and scan mirror configuration.

FIG. 4 illustrates a spatial-frequency domain scanning Köhler illuminator that is particularly suited for visible light applications. A collimated beam of light from a source (not shown) such as a laser is directed toward the back focal plane of a source-collimating optic 154 and scanning mirror 152 which serves as the effective source of radiation. Multiple scan positions, e.g., 156, 158, are generated as scanning mirror 152 is scanned to effectively change or move the image point around at the back focal plane of lens 154. Optic 154 can also be viewed as re-imaging the scanner mirror to the entrance pupil of the downstream optical system.

Figure 5:
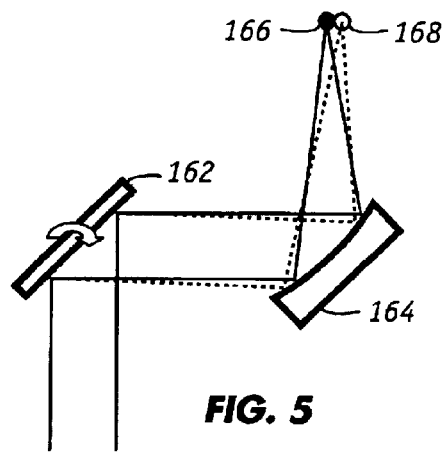
FIGS. 5 and 6 illustrate spatial-frequency domain scanning Köhler illuminators shown in all-mirror configuration.

FIG. 5 illustrates a spatial-frequency domain scanning Köhler illuminator which is analogous to that of FIG. 4 except that it is an all-mirror configuration. As is apparent, radiation, a collimated EUV beam is directed toward the front focal plane of a source-collimating optic 164 and where scanning mirror 162 is positioned to serve as the effective source of radiation. Multiple scan positions, e.g., 164, 168, are generated as scanning mirror 162 is scanned effectively moving the image point around at the back focal plane of mirror 164.

Figure 6:
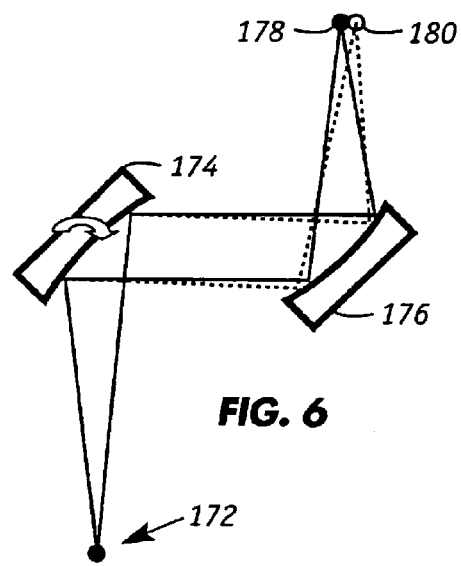

FIG. 6 illustrates an alternative all-mirror configuration for the spatial-frequency domain scanning Köhler illuminator where the source 172 is not assumed to be a plane wave (as in FIG. 5) and the source collimation and scanning functions are combined into a single optic, e.g., spherical mirror, 174. Specifically, multiple scan positions, e.g., 178, 180 are generated as scanning mirror 174 is scanned to effectively change or move the image point around at the back focal plane of mirror 176.

Dual-Domain Scanning Köhler Illuminator for Providing Coherence and Illumination-Extent Control for Microfield Lithography Applications Another important factor when designing an illuminator is the field size and shape. It is desirable to illuminate as much of the imaging system's well-corrected field as possible. In a Köhler illuminator as described above, the illumination size is determined by the divergence of the effective source combined with the size of the collimator optic and its distance from the effective source. If the source has limited divergence, the illumination area will be small. Additionally, imaging optics are often designed with asymmetric fields, therefore for optimal illumination efficiency of such a field one would require a source with asymmetric divergence matched to the particular imaging systems field shape. Extending the scanning functionality described above for generating a desired source size, a scanning process can also be used to generate a desired source divergence. In this case both crucial illuminator parameters (coherence and field size) are under scanning control and fully programmable. In the dual-scanning mode, the single point source described above is itself synthesized through a scanning process. Thus that point can be made to have any desired divergence.

For this technique, both the spatial extent of the source and the divergence (spatial frequency extent) of the source are synthesized, thus it is referred to as a "dual domain" scanning system. To achieve this, the dual domain devices employ a second scanner, that is, these systems have two simultaneously scanning mirrors.

Figure 7:
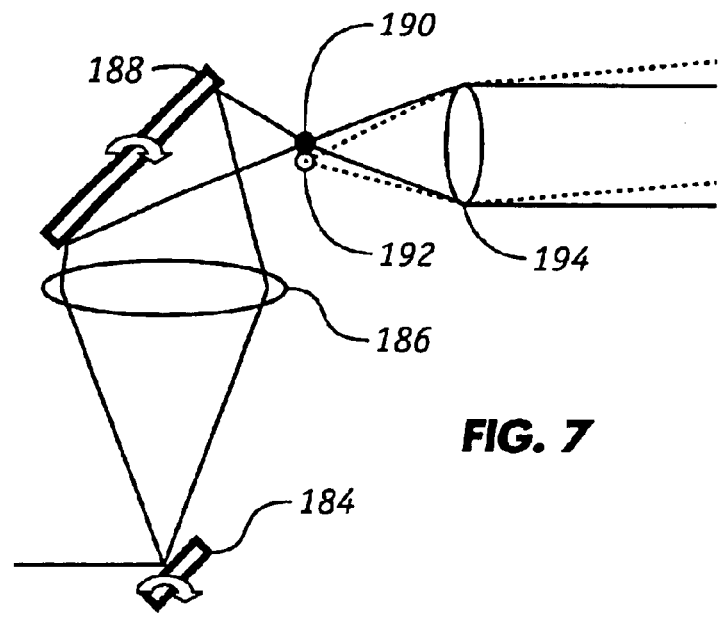
FIG. 7 illustrates a dual-domain scanning Köhler illuminator shown in simple lens and scan mirror configuration.

FIG. 7 illustrates a dual-domain scanning Köhler illuminator that employs transmission, e.g., refractive, lenses so that it is particularly suited for visible light applications. In this configuration, radiation from a low-divergence source, e.g., collimated beam of visible light, is reflected from the first scanning mirror 184, referred as the "divergence-synthesis mirror," that controls the divergence, i.e., coherence, of the beam. Radiation from mirror 184 is imaged by optic 186 and directed toward the second scanning mirror 188, referred as the "source-size-synthesis scanning mirror." By scanning mirrors 184 and 188, multiple scan positions, e.g., 190,192, are generated and radiation therefrom is collimated with optic 194. Thus a large incoherent source is generated from a small low-divergence source.

Scanning mirrors 184 and 188 each are scanned in two dimensions (2-D) and can be controlled by tip/tilt mechanisms described above for mirror 410 of FIG. 1A. In this dual-scanning case it is important that the entire target divergence be synthesized for each synthesized source point, thus the divergence scanner must be fast enough to travel through its full 2-D range at each source scan point. In other words, the divergence scanner must be much faster than the source size scanner. For example, if the source size scanner is programmed to scan through a total of 100 source points in 1 second, the divergence scanner will have to scan through its entire target 2-D range in 1/100 of a second. As for the single scan mode, the observation (image integration) time, must be at least as long as it takes to scan through all desired source points. It is noted, however, that the relative relationship of the scanner speeds can be reversed such that at each divergence angle, the full 2-D range of source points is synthesized, thus here the source size scanner must be faster than the divergence scanner. In this case, the integration time must be at least as long as it takes for the divergence scanner to complete its entire 2-D target range.

The source imaging and collimating optics can be conventional transmission lenses and the scanning mirrors can be fabricated of any suitable surface that is reflective to visible radiation. For example, the surface can be fabricated from polished aluminum, silver, or chromium. Preferably, the scanning mirror is a flat mirror, which is a mirror whose surface is nearly flat within manufacturing tolerances. The function of the single element for each of the imaging and collimating optics can be provided by a more complex multi-element or compound optical system. Morever, the function of the 2-D scanning elements can be provided by combining multiple 1-D scanning elements. Similar designs of the scanning mirror, source imaging optic and collimating optic are applicable for the other dual domain embodiments that employ simple lens and scan mirror systems for visible light as described herein.

Figure 8:
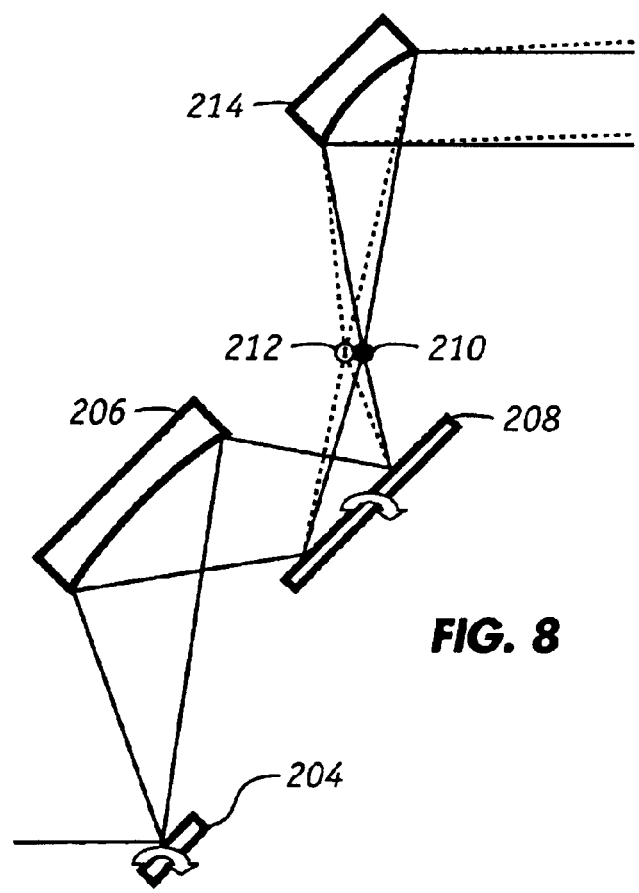
FIGS. 8 and 9 illustrate all-mirror configurations for the dual-domain scanning Köhler illuminator.

FIG. 8 illustrates a dual-domain scanning Köhler illuminator having a configuration that is analogous to that of FIG. 7 except this all-mirror system permits EUV applications. As shown, radiation from a low-divergence source is reflected from the first scanning mirror 204, the "divergence-synthesis mirror," that controls the divergence, i.e., coherence, of the beam. Radiation from mirror 204 is imaged by optic 206 and directed toward the second scanning mirror 208, the "source-size-synthesis scanning mirror." By scanning mirrors 204 and 208, multiple scan positions, e.g., 210,212, are generated and radiation therefrom is collimated with optic 214. Thus a large incoherent source is generated from a small low-divergence source.

Each of the scanning mirrors 204 and 208, source imaging optic 206, and collimating optic 214 can be fabricated of any suitable surface that is reflective to EUV radiation or may be made reflective to EUV radiation by deposition of a reflective multilayer. Preferably, the scanning mirror is a flat mirror, which is a mirror whose surface is nearly flat within manufacturing tolerances. In the preferred embodiment for each of the source imaging optic 206 and collimating optic 214, its function is preferably provided by a single conventional concave spherical, whose surface forms part of a sphere. Although the present invention employs the use of spherical mirrors for convenience and economical concerns, it is intended that other mirrors be covered by the present invention, such as toroidal, and conic section, e.g., parabolic, hyperbolic, general aspheric, elliptical, cylindrical, etc., mirrors that may be substituted for spherical mirrors within tolerable industry standards, including those with minor flaws and aberrations. Also as described above, the function of the single source imaging optic and collimating optic could also be provided by a more complex multi-element optical system, however, compound systems tend to be less efficient. Morever, the function of the 2-D scanning elements can be provided by combining multiple 1-D scanning elements. Similar designs of the scanning mirror, source imaging optic and collimating optic are applicable for the other dual domain embodiments that employ all mirror configurations for EUV radiation as described herein.

Figure 9:
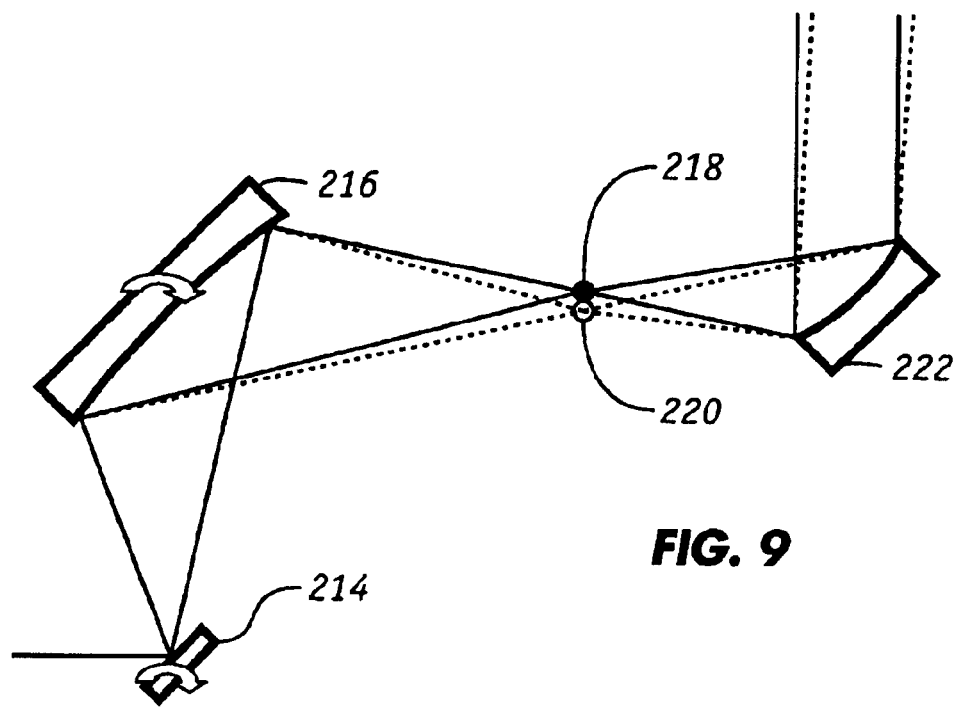

FIG. 9 illustrates another dual-domain scanning Köhler illuminator employing an all-mirror configuration which is similar to that of FIG. 8 except that the effective-source imaging and source-size synthesis scanning functions are combined into a single optic 216. As shown, radiation from a low-divergence source is reflected from the divergence-synthesis scanning mirror 214 (effective source 1). Radiation from mirror 214 is directed toward the source-size-synthesizing and effective source 1 scanning mirror 216. By scanning mirror 216, multiple scan positions (e.g., 218 and 220) are generated and radiation therefrom is collimated with optic or condenser 222.

Figure 10:
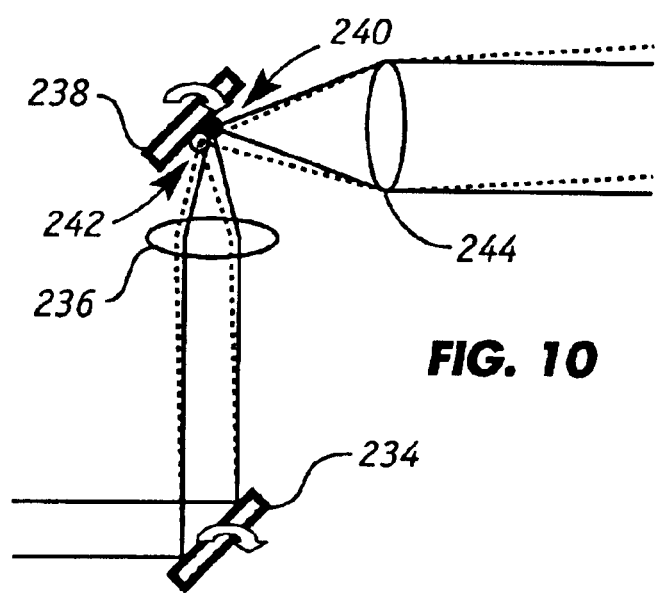
FIG. 10 illustrates a dual-domain scanning Köhler illuminator shown in simple lens and scan mirror configuration.
Figure 11:
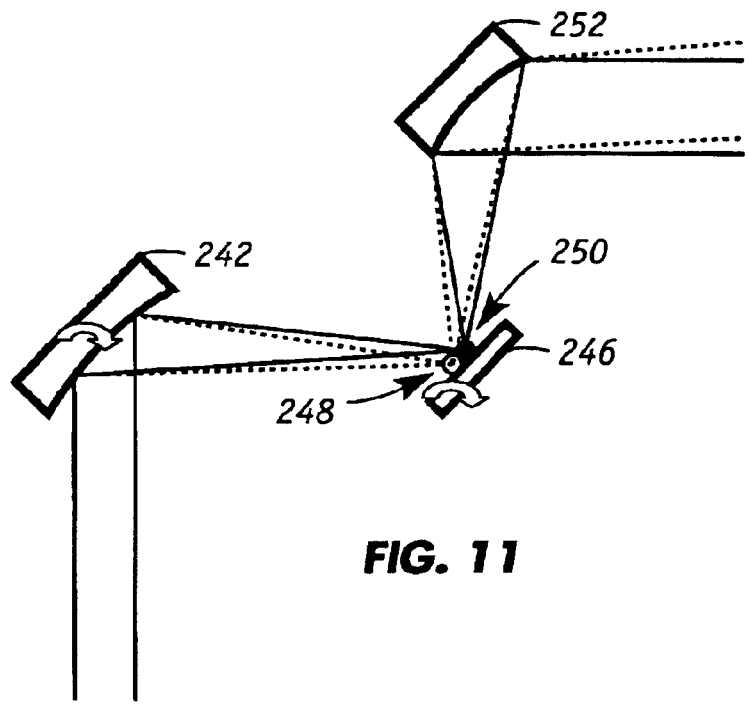
FIG. 11 illustrates an all-mirror configuration for the dual-domain scanning Köhler illuminator.

FIGS. 10 and 11 illustrate dual domain systems where the source size synthesis is performed by the first active optic and the divergence synthesis by the second active optic. These devices are particularly suited for coherence and illumination-extent control of large collimated beams as opposed to point sources.

FIG. 10 illustrates a dual-domain scanning Köhler illuminator employing the simple lens and scan mirror configuration. Radiation from a low-divergence source, e.g., collimated beam of visible light, is reflected from the source-size-synthesis scanning mirror 234 and radiation therefrom is imaged by optic 236 and directed toward the divergence-synthesis scanning mirror 238. Multiple scan positions, e.g., 240 and 242, are generated and radiation reflected from mirror 238 is collimated with optic 244.

FIG. 11 illustrates an all-mirror configuration for the dual-domain scanning Köhler illuminator similar to the lens configuration shown in FIG. 10. In this embodiment, the first active optic 242 synthesizes the desired source size and images the original source to the second active optic 246. Scanning mirror 242 generates multiple positions 248 and 250 on the surface of mirror 246. The second active optic synthesizes the desired source divergence and radiation therefrom is collimated with optic 252.

Figure 12:
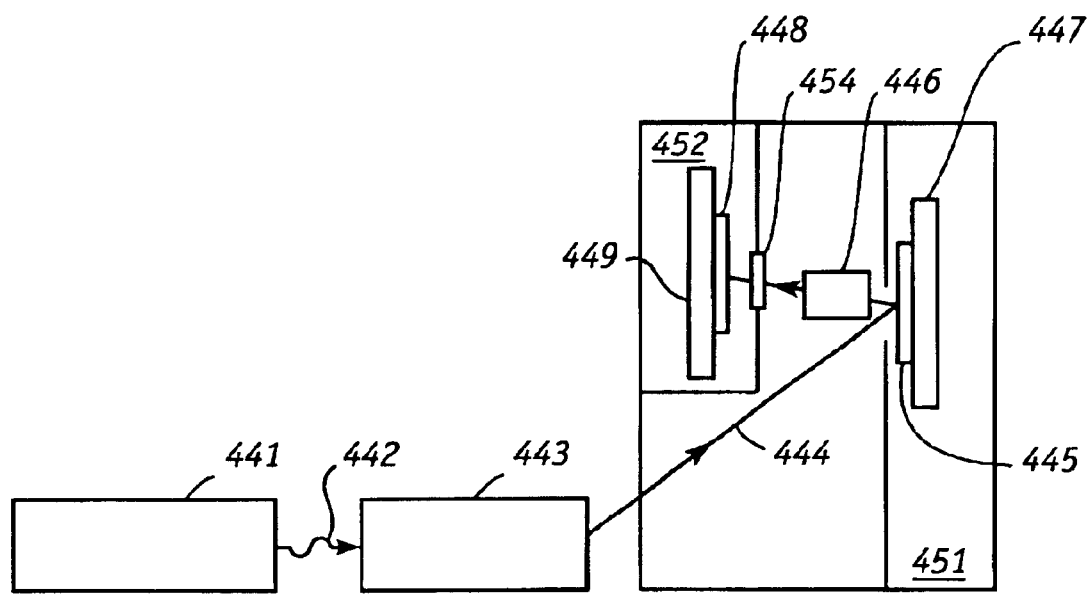
FIG. 12 illustrates a photolithography system.

FIG. 12 schematically depicts an EUV lithography apparatus that employs the illuminator of the present invention. The apparatus comprises a radiation source 441, such as a synchrotron or a laser plasma source, that emits x-rays 442 into condenser 443 which in turn emits beam 444 that illuminates a portion of reticle or mask 445. The emerging patterned beam is introduced into the imaging optics 446 which projects an image of mask 445, shown mounted on mask stage platen assembly 447, onto wafer 448 which is mounted on wafer stage platen assembly 449. The stage platen assemblies 447 and 449 comprise a stage platen of the present invention and associated components for its maneuver. Precision movement of stage platen assemblies can be implemented by known mechanisms as described, for example, in U.S. Pat. Nos. 5,623,853 and 5,699,621 which are incorporated herein by reference.

Figure 13:
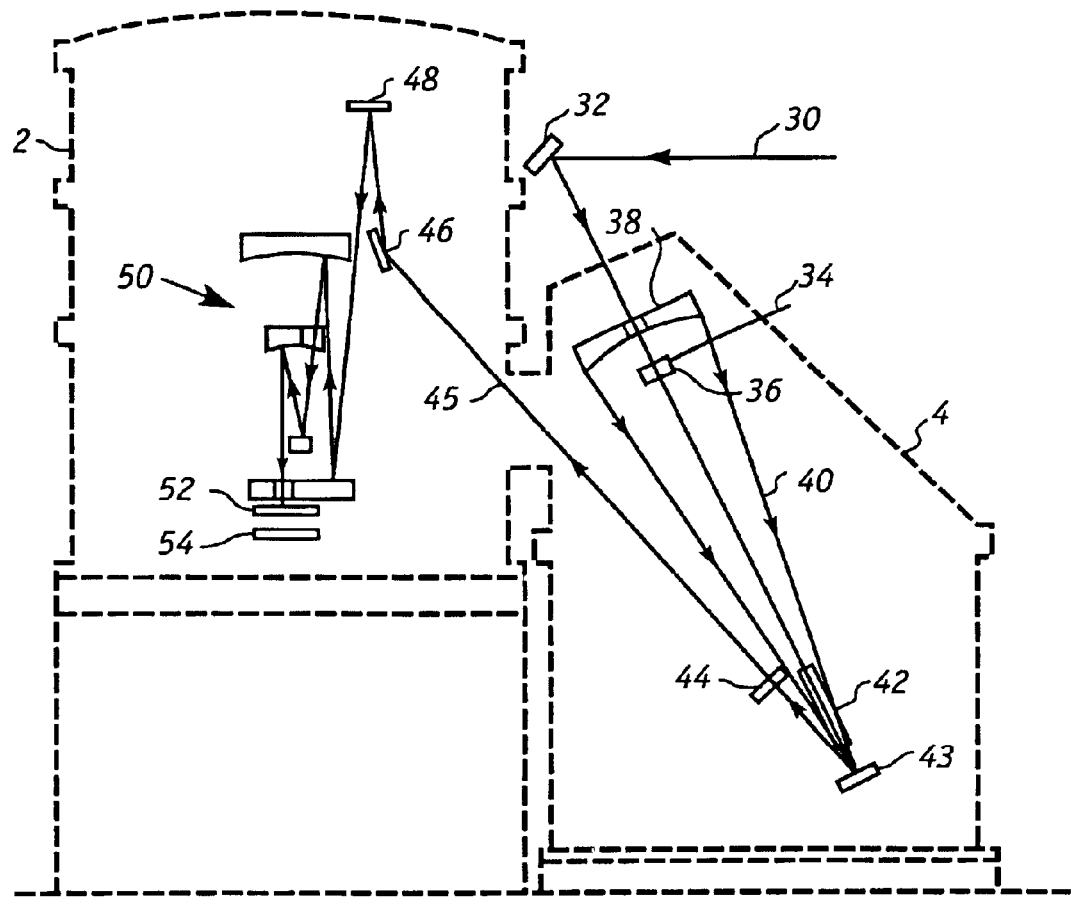
FIG. 13 illustrates a prior art EUV lithography machine.

In a preferred embodiment, the stage platen assemblies 447 and 449 are housed in separate chambers that are separated from the other elements of the photolithography system located upstream as illustrated in FIG. 13. Stage platen assembly 447 supporting mask 445 is housed in mask chamber or zone 451 which is typically maintained at sub-atmospheric pressure preferably between 1 mTorr to 100 mTorr. Similarly, stage platen assembly 449 supporting wafer 448 is housed in wafer chamber or zone 452 which is preferably maintained at a pressure below about 100 mTorr. Chamber 452 includes a window 454 that is made of a suitable material that transmits EUV. The other elements can be housed in one or more chambers which are preferably maintained in vacuum to minimize attenuation of the x-rays. EUV radiation projected from the mask and translated by a camera travels through an aperture in the wafer chamber. Suitable lithographic optics are described in U.S. Pat. Nos. 6,226,346, 6,188,513, 6,072,852, and 6,033,079 to Hudyma et al., which are incorporated herein by reference.

For lithographic applications, the illumination that is produced by the illuminator typically has a partial coherence (sigma) that ranges from about 0.1 to 1; for many applications, the illuminator has a partial coherence of about 0.7.

A preferred source of the coherent or partially coherent radiation is a synchrotron radiation source, which is a broadband source capable of operating from the x-ray through infrared regimes. The synchrotron is constructed from a storage ring providing for relativistic electrons or positrons confined by magnetic fields to a repeating orbital path. A suitable source is the synchrotron undulator beamline source (CXRO beamline 12.0.1.2 at the Advanced Light Source, Lawrence Berkeley National Laboratory) operating at a wavelength of 13.44 nm with a bandwidth $\lambda/\Delta\lambda$ of about 200.

Although only preferred embodiments of the invention are specifically disclosed and described above, it will be appreciated that many modifications and variations of the present invention are possible in light of the above teachings and within the purview of the appended claims without departing from the spirit and intended scope of the invention.

What is claimed is:

1. An illuminator device for an optical image processing system, wherein the image processing system comprises an optical system requiring partially coherent illumination, and where the illuminator comprises:
    a small point-like source of coherent or partially coherent radiation which has an intrinsic coherence that is higher than the desired coherence;
    a source imaging optic that receives incident radiation from said source;
    a scanning optic that moves the focal location of imaged point source effectively creating an incoherent spatially extended source;
    means for moving said scanning surface through a desired range of angles in two dimensions wherein the rate of motion is fast relative to integration time of said image processing system; and
    a collimating optic wherein each source point of the spatially extended source generates a plane wave emanating in a different direction.

2. The illuminator of claim 1 wherein the source imaging optic and scanning surface are combined into a single optic.

3. The illuminator of claim 1 where one or more of the imaging, collimating and scanning optics are compound systems.

4. An illuminator device for an optical image processing system, wherein the image processing system comprises an optical system requiring partially coherent illumination, and where the illuminator comprises:
    a source of coherent or partially coherent radiation which has an intrinsic coherence that is higher than the desired coherence;
    a scanning optic which receives incident radiation from said source and creates an incoherent effective source consisting of plane waves emanating in different directions;
    means for moving said scanning surface through a desired range of angles in two dimensions wherein the rate of motion is fast relative to integration time of said image processing system;
    an imaging optic which re-images said scanning surface to the entrance pupil of said optical image processing system;
    an aperture on the scanning optic to control the effective source size; and
    means for controlling said aperture size and thus partial coherence of effective source.

5. The illuminator of claim 4 where one or both of the scanning and collimating optics are compound systems.

6. The illuminator of claim 4 wherein the source imaging optic and scanning surface are combined into a single optic.

7. A method for modifying the coherence of a beam of radiation from a high coherence radiation source with higher than desired intrinsic coherence that comprises:
    directing the beam of radiation into a source imaging reflective optic which forms a real image of the source;
    redirecting the beam with a reflective surface positioned between said source imaging optic and said image of source;
    moving said reflective surface through a desired range of angles in two dimensions wherein the rate of motion is fast relative to the subsequent observation time; and
    collimating the light emanating from the image of the source thereby converting the imaged source points into plane waves.

8. The method of claim 7 wherein the source imaging optic and reflective surface are combined into a single optic.

9. The method of claim 7 where one or more of the imaging, collimating and scanning optics are compound systems.

10. A method for modifying the coherence of a beam of radiation from a high coherence radiation source with higher than desired intrinsic coherence that comprises:
    directing the beam of radiation into a reflective surface that creates a plane wave;
    modifying the source size by masking the reflective surface;
    moving the reflective surface through a desired range of angles in two dimensions wherein the rate of motion is fast relative to the subsequent observation time; and
    focusing the beam reflected from said moving surface using a mirror positioned such that said moving surface lies substantially in the front focal plane of said focusing mirror.

11. An illuminator device for an optical image processing system, wherein the image processing system comprises an optical system requiring partially coherent illumination, and where the illuminator comprises:
    a small point-like low divergence source of coherent or partially coherent radiation which has an intrinsic coherence that is higher than the desired coherence;

a divergence-synthesis scanning optic that receives incident radiation from said source and generates a first effective source with desired source divergence;

means for moving said divergence synthesis scanning optic through a desired range of angles in two dimensions wherein the rate of motion is fast relative to integration time of said image processing system;

a source imaging optic that receives incident radiation from said divergence optic and images the first effective source;

a scanning optic that moves the focal location of said imaged first effective source creating a second effective source which has the character of an incoherent spatially extended source with desired spatial extent;

means for moving said scanning surface through a desired range of angles in two dimensions wherein the rate of motion is fast relative to said scan speed of said diverge synthesis scanning optic; and a collimating optic wherein points of the second effective source generates plane waves emanating in a different directions.

12. The illuminator of claim 11 wherein the source imaging optic and scanning optic are combined into a single optic.

13. The illuminator of claim 11 wherein one or more of the divergence-synthesis, imaging, scanning and collimating optics are compound systems.

14. The illuminator of claim 11 wherein the divergence-synthesis optic is asymmetrically scanned to match asymmetric field shape of the imaging optics.

15. An illuminator device for an optical image processing system, wherein the image processing system comprises an optical system requiring partially coherent illumination, and where the illuminator comprises:

a low divergence source of coherent or partially coherent radiation which has an intrinsic coherence that is higher than the desired coherence;

a source-size synthesis scanning and imaging optic that receives incident radiation from said low divergence source and moves the focal location creating a first effective source which has the character of an incoherent spatially extended source with desired spatial extent;

means for moving said source-size synthesis scanning and imaging optic through a desired range of angles in two dimensions wherein the rate of motion is fast relative to integration time of said image processing system;

a divergence-synthesis scanning optic positioned substantially in the image plane of said source-size synthesis optic that receives incident radiation from the first effective source and generates a second effective source 2 with desired source divergence;

means for moving said divergence synthesis scanning optic through a desired range of angles in two dimensions wherein the rate of motion is fast relative to the scan speed of said source-size synthesis scanning optic; and a collimating optic wherein points of the second effective source generates plane waves emanating in a different directions.

16. The illuminator of claim 15 where one or more of the source-size synthesis scanning and imaging, divergence-synthesis, and collimating optics are compound systems.

17. The illuminator of claim 15 wherein the divergence-synthesis optic is asymmetrically scanned to match asymmetric field shape of the imaging optics.

18. A method of modifying the coherence and field size of a beam of radiation that comprises:

directing the beam of radiation onto a first reflective surface;

increasing the source divergence by moving said first reflective surface through a desired range of angles in two dimensions wherein the rate of motion is fast relative to the subsequent observation time;

directing output of the divergent source onto a second reflective surface which forms a real image of said moving first reflective surface;

increasing the source size by moving said second reflective surface through a desired range of angles in two dimensions wherein the rate of motion is fast relative to said rate of motion of said first reflective surface; and collimating the image points created by said second moving reflective surface using a third reflective optic positioned such that said real image of the first reflective surface lies substantially in the front focal plane of said third reflective optic.

19. The method of claim 18 where one or more of the divergence-synthesis, imaging, scanning and collimating optics are compound systems.

20. The illuminator of claim 18 wherein the divergence-synthesis optic is asymmetrically scanned to match asymmetric field shape of the imaging optics.

21. A method of modifying the coherence and field size of a beam of radiation that comprises:

directing the beam of radiation onto a first scanning and focusing reflective optic that focuses the beam onto a second reflective surface;

increasing the source size by moving said first reflective surface through a desired range of angles in two dimensions wherein the rate of motion is fast relative to the subsequent observation time;

redirecting the beam by reflecting from said second reflecting surface;

increasing the source divergence by moving said second reflective surface through a desired range of angles in two dimensions wherein the rate of motion is fast relative to said rate of motion of said first reflective surface; and collimating the diverging beam emanating from said second reflective surface using a third reflective optic positioned such that said second reflective surface lies substantially in the front focal plane of said third reflective optic.

22. The method of claim 21 wherein one or more of the scanning and imaging, divergence-synthesis, and collimating optics are compound systems.

23. The method of claim 21 wherein the divergence-synthesis optic is asymmetrically scanned to match asymmetric field shape of the imaging optics.

* * * * *